(12) United States Patent
Serbutoviez et al.

(10) Patent No.: US 8,617,713 B2
(45) Date of Patent: Dec. 31, 2013

(54) BONDING LAYER ON FLUOROPOLYMERS

(75) Inventors: Christophe Serbutoviez, Voiron (FR); Mohamed Benwadih, Champigny sur Marne (FR); Jean-Marie Verilhac, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 932 days.

(21) Appl. No.: 12/174,682

(22) Filed: Jul. 17, 2008

(65) Prior Publication Data

US 2009/0035565 A1 Feb. 5, 2009

(30) Foreign Application Priority Data

Aug. 1, 2007 (FR) ...................................... 07 05621

(51) Int. Cl.
*B32B 27/00* (2006.01)

(52) U.S. Cl.
USPC ............................ 428/421; 428/411.1; 257/40

(58) Field of Classification Search
None
See application file for complete search history.

(56) References Cited

U.S. PATENT DOCUMENTS

| | | | | |
|---|---|---|---|---|
| 4,053,376 A | * | 10/1977 | Carlin | ............................ 205/556 |
| 4,916,020 A | * | 4/1990 | Golding et al. | ................ 428/421 |
| 5,718,947 A | * | 2/1998 | Martin et al. | .................. 427/243 |
| 5,993,907 A | | 11/1999 | Aikman, Jr. | |
| 2004/0197629 A1 | * | 10/2004 | Arishima et al. | ................ 429/30 |
| 2005/0104058 A1 | * | 5/2005 | Veres et al. | ....................... 257/40 |
| 2005/0247928 A1 | | 11/2005 | Unno | |
| 2005/0263756 A1 | * | 12/2005 | Yatsunami et al. | .............. 257/40 |
| 2005/0272989 A1 | * | 12/2005 | Shah et al. | ..................... 600/345 |
| 2006/0151781 A1 | | 7/2006 | Kim et al. | |

FOREIGN PATENT DOCUMENTS

| | | |
|---|---|---|
| GB | 2 302 693 A1 | 1/1997 |
| WO | 2007/082584 A1 | 7/2007 |

OTHER PUBLICATIONS

Trevino and Young, Morphology and Morphological Changes Within Nafion Membranes Induced by Mechanical Orientation, 2002, Army Research Laboratory, ARL-TR-2700, pp. 1-13.*

Trogadas, Electrolyte degradation and degradation mitigation in polymer electrolyte fuel cells, Illinois Institute of Technology, 2009, pp. 1-16, http://www.grin.com/en/doc/244413/electrolyte-degradation-and-degradation-mitigation-in-polymer-electrolyte.*

* cited by examiner

*Primary Examiner* — Callie Shosho
*Assistant Examiner* — Patrick English
(74) *Attorney, Agent, or Firm* — Burr & Brown, PLLC

(57) ABSTRACT

The invention relates to a device comprising a layer made from a fluoropolymer, of which at least part of the surface is covered with a composition comprising a polymer having at least one fluorinated function and at least one acid or base function and forming a bonding layer on said fluoropolymer, said bonding layer being fully or partly covered by another layer.

15 Claims, 1 Drawing Sheet

BONDING LAYER ON FLUOROPOLYMERS

FIELD OF THE INVENTION

The present invention relates to devices incorporating fluoropolymer layers. It proposes to at least partially cover the layers with an additional layer called "bonding layer", for facilitating the deposition of subsequent layers.

Such a bonding layer is prepared using polymers having at least one fluorinated function and at least one acid or base function.

BACKGROUND OF THE INVENTION

Fluoropolymers are commonly used in various technical fields today. Thus, fluoropolymers are used in the manufacture of electronic components such as organic transistors, or electrical insulation, and in the fabrication of mechanical parts subject to extreme service conditions (temperature or the presence of aggressive solvents).

In the particular case of organic electronics, fluoropolymers, and in particular Cytop® (trade name of poly perfluoro butenyl vinyl ether), have particularly suitable properties for constituting the grid dielectric of a transistor.

However, the use of such fluoropolymers raises the following problems, still unsolved today:
  it is impossible, using a wet method, to deposit other layers on a fluoropolymer previously deposited in a thin film, regardless of the deposition method (spin-coating or various printing methods); and
  it is impossible to bond two fluoropolymer parts together, or to bond a plastic to a fluoropolymer.

This makes highly problematic the manufacture of complex devices comprising various elements indispensable for their operation. This is the case for example of a complete transistor, in which the placement of a dielectric requires subsequent manufacturing steps.

An obvious need therefore exists to develop technical solutions for facilitating and improving the deposits on fluoropolymer based layers.

SUMMARY OF THE INVENTION

The present invention is based on the Applicant's finding that certain fluoropolymers develop aptitudes to adhere to materials, and in particular to fluoropolymers.

Essentially, these particular fluoropolymers, having adhesive properties, carry at least one acid or base function.

According to a first aspect, the present invention therefore relates to a device, in particular a transistor, comprising a layer made from a fluoropolymer, of which at least part of the surface is covered with a composition comprising at least a polymer having at least one fluorinated function and at least one acid or base function.

According to the invention, the composition comprising at least the polymer having at least one fluorinated function and at least one acid or base function forms a bonding layer on the fluoropolymer. This bonding layer is itself partly or fully covered by one or more other layers made with materials of interest.

By definition, the device therefore partly consists of a first fluoropolymer. This part is called "layer", insofar as it has outer surfaces which are intended to be covered, at least partially or fully, by at least the bonding layer according to the invention.

In the context of the present invention, fluoropolymer means a polymer or a copolymer of which at least one of the component monomers contains at least one fluorine (F) atom per monomer. This polymer may be crosslinked or non-crosslinked.

Such polymers are, for example, selected from the following list:
  Teflon®: trade name of polytetrafluoroethylene (PTFE) (sold by DuPont);
  Cytop®: trade name of poly perfluoro butenyl vinyl ether (sold by Ashai Glass);
  Halar® (sold by Solvay Solexis);
  Hyflon® (sold by Solvay Solexis);
  Parylene-F (sold for example by Aldrich).

Note that these references are well known to a person skilled in the art in the field of polymers, but of which the exact chemical formula is not always available.

Cytop® is advantageously selected from this list.

It will clearly appear from a reading of the rest of the description that this first fluoropolymer lacks any acid or base function.

The second polymer, used for the formation of the bonding layer according to the invention, is a polymer or a copolymer defined as follows:
  at least one of its component monomers contains at least one fluorine (F) atom per monomer. In this respect, it is therefore a second fluoropolymer;
  at least one of its component monomers contains an acid or base function. In the context of the present invention, the acid or base functions are defined by Brönsted or Lewis.

Polymers answering to this definition are for example:
Nafion® (DuPont);
Hyfion Ion® (Solvay Solexis);
Flemion® (Ashai Glass).

Here also, these are references well known to a person skilled in the art in the field of polymers, but of which the exact chemical formula is still unavailable.

Preferably, the acid function is provided by a carboxylic, phosphonic, sulfonic, sulfone or $Si(CH_3)_3$ function. The base function may be an amine.

According to an advantageous embodiment, the monomer having at least one fluorinated function is of the same type as the monomer present in the fluoropolymer. This is the case for example of the pair Teflon® (first fluoropolymer)/Nafion® (second fluoropolymer) which both comprise monomers of tetrafluoroethylene.

Advantageously, the fluorinated function and the acid or base function are carried by the same monomer. This is the case for example of Nafion®, of which the monomers of tetrafluoroethylene incorporate perfluorovinyl ether groups terminating in sulfonic groups.

It has been found that such a polymer carrying at least one fluorinated function and at least one acid or base function has aptitudes to adhere both to fluoropolymers, such as Teflon® and Cytop® (or equivalent materials), and to other materials, for example adhesive. Teflon® thus covered permits the adhesion of a conductive ink, of another part made from Teflon® or from another material (for example melamine), etc.

The bonding layer thus formed, which advantageously has a thickness of between 20 nm and 2 µm, can thus be partly or fully covered by one or more other layers prepared with materials of interest. They may be electrodes, semiconductive materials, dielectrics, layers of ink or adhesive.

It should be noted that for applications related to electronics in particular, it is desirable that the acid or base groups present in the fluoropolymer are not oriented under an electric field. To prevent this from occurring, it is recommended, in the composition serving for the formation of the bonding layer, to combine compounds of the molecule or polymer type creating bonds with the acid or base sites of the fluoropolymer. These bonds may be of the low energy interaction type, for example hydrogen bonds. Alternatively, an acid-base reaction may take place in solution between the fluoropolymer and the compound.

Furthermore, it is conceivable to mix the fluoropolymer carrying the acid or base functions directly with a material of interest, such as a resin, particularly of photolithography, inks in particular conductive inks, or dielectrics. Such a mixture also has a strong affinity for fluoropolymer based substrates. In this particular case, the layer placed on the bonding layer may for example consist of a metal to constitute electrical contacts.

According to a preferred embodiment, the inventive device is a transistor.

The present invention therefore serves to modify the surface of a fluoropolymer using a second fluoropolymer, and thereby to make the surface of the first fluoropolymer compatible with processes such as printing, spin-coating or bonding.

According to another aspect, the invention therefore relates to a method for fabricating a device as defined above, comprising:
  in a first step, the deposition, on all or part of the outer surface of the fluoropolymer layer, of a composition comprising a polymer having at least one fluorinated function and at least one acid or base function, in order to form a bonding layer after drying;
  in a second step, the deposition of a material of interest on this bonding layer, in order to form another layer (functional layer) after drying.

The deposition of the second fluoropolymer on the first can be carried out either by dip-coating, or by spin-coating, or by printing (inkjet, flexography, heliography, etc.). These techniques can be implemented for the second deposition.

The second polymer, carrying at least one fluorinated function and at least one acid or base function, is generally formulated in a composition suitable for the deposition technique employed.

Such a composition may be in the form of a solution comprising from 0.3 to 5% by weight of the polymer having at least one fluorinated function and at least one acid or base function.

A solvent suitable for dissolving said polymer is selected and incorporated in the composition. It may for example be isopropanol.

Typically, after deposition and drying, the second polymer forms a thin film the thickness of which is between 20 nm and 2 μm. This thickness depends in particular on the fluoropolymer concentration of the layer on which the deposition is made.

This composition may also be enriched with one or more polymers or compounds having a chemical structure close to the structure of the layer or of the material that is added on to the second polymer. In fact, in a subsequent step of the fabrication method, a material of interest is advantageously deposited on the layer thus formed.

By way of example, such a composition has the following formula (% by weight):
  4% Nafion 2021;
  90% isopropanol;
  4% polyvinyl phenol;
  2% melamine.

The bonding layer obtained with this composition is particularly suitable for receiving (and in particular for being covered fully or partly) a layer based on polyvinylphenol crosslinked by melamine formol. This layer serves to limit the electrical leakage of the complete stack.

BRIEF DESCRIPTION OF THE DRAWINGS

The way in which the invention can be implemented and the advantages thereof will appear more clearly from the exemplary embodiments that follow, provided for information and nonlimiting, in conjunction with the appended figures.

DETAILED DESCRIPTION OF THE INVENTION

First Application: Organic Transistors

It is now acknowledged that to obtain organic transistors with low hystereses and high mobilities, it is necessary for the grid dielectric to consist of a polymer having a low K (J. Veres et al. "*Gate Insulators in Organic Field-Effect Transistors*", Chem. Mater. 2004, 16, 4543-4555).

Among the low K polymers often used for the manufacture of organic transistors, fluoropolymers are materials of choice. However, the incorporation of such materials in the fabrication of transistors is not an easy matter. The major problem observed is that it is impossible, using wet methods (spin-coating or printing) to deposit on these materials, the other layers making up the stack of a transistor.

Figure 1:
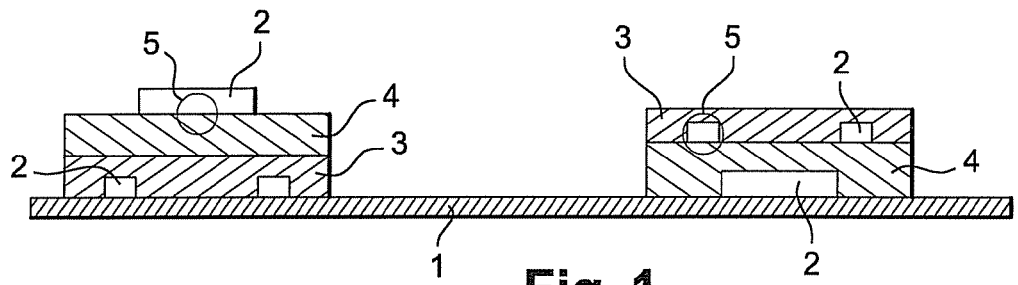
FIG. 1 shows a schematic of the transistor obtained by the prior art methods.

FIG. 1 shows the various steps in the fabrication of an organic transistor according to the prior art.

For the top grid, the following are deposited in succession on a substrate (1):
  two electrodes (2), called source and drain;
  a semiconductive material (3);
  a layer of fluoropolymer (4) corresponding to the first fluoropolymer;
  the second electrode (2) called grid electrode.
And for the bottom grid:
  an electrode (2) called grid;
  a layer of fluoropolymer (4) corresponding to the first fluoropolymer;
  the second electrodes (2), called source and drain;
  a semiconductive material (3).

Due to the abovementioned difficulties of deposition on the layer of fluoropolymer (4), an adhesion (5) deficiency exists between this layer and the upper layer, that is the electrode (2) and/or the semiconductive material (3). A lack of uniformity of the layers is also observed.

Thanks to the present invention, it is possible to deposit conductive inks by screen printing or by inkjet printing. It is thereby possible, for example, to print the grid or the source and the drain of a transistor.

Figure 2:
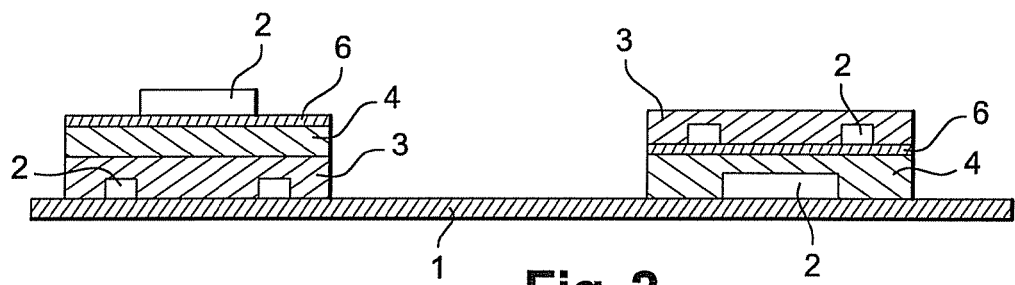
FIG. 2 shows a schematic of a transistor obtained according to the present invention, comprising a bonding layer.

FIG. 2 shows the placement of a bonding layer according to the invention (6) between the fluoropolymer (4) layer and the electrodes (2) and/or the semiconductive material (3).

Figure 3:
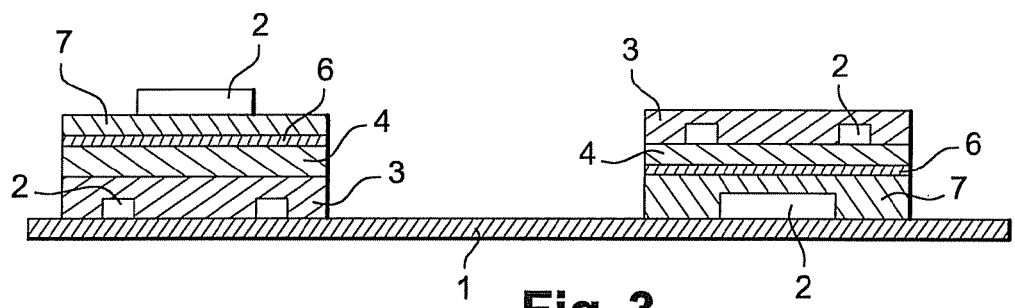
FIG. 3 shows a schematic of a transistor obtained according to the present invention, comprising a bonding layer and an additional dielectric layer.

On such a bonding layer (6), it is also possible to deposit other dielectrics (7) in a thin film, such as polyimides or silsesquioxanes, or PVP (polyvynilphenol) melamine formol, as shown in FIG. 3. Here also, the deposition can be obtained by conventional techniques such as spin-coating or printing methods.

Second Application: Patterns on Water-Repellent Fabrics or Substrates

A bonding layer according to the invention can be used for printing patterns on water-repellent fabrics or substrates, in which the water repellency is provided by a conventional fluoropolymer.

In this case, the substrate is treated by a polymer having at least one fluorinated function and at least one acid or base function, by dip-coating or by printing methods such as flexography, inkjet heliography. After drying, the surface becomes compatible with conventional printing methods.

Third Application: Bonding of Two Fluoropolymer Parts

A bonding layer according to the invention can be used for bonding a part that is molded or machined in a fluoropolymer, with a second material which may not necessarily be a fluoropolymer.

Figure 4:
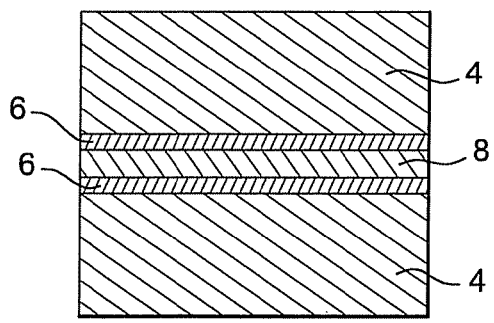
FIG. 4 shows a cross section of two fluoropolymer parts bonding together by means of bonding layers according to the invention.

In this case, shown in FIG. 4, the fluoropolymer (4) parts are coated with a polymer having at least one fluorinated function and at least one acid or base function (6), by dip-coating. Their interfaces become compatible with adhesives such as cyanoacrylate or epoxy/amine, cationic epoxy, UV acrylic (8). It is thereby possible to obtain a cohesive fracture of the adhesive seal.

Fourth Application: Combination of the Polymer Carrying at Least One Fluorinated Function and at Least One Acid or Base Function with Other Compounds

Example 1

5% by weight of a solution of Nafion® 2021 (DuPont) was added to S1818 photolithography resin (Shipley). The mixture was deposited by spin-coating on a polyethylene naphthalene substrate, previously coated with a layer of Cytop® fluoropolymer. The resin was annealed, exposed and developed as recommended by the resin manufacturer. It was then possible to carry out the steps of etching of the Cytop® layer.

Example 2

8% by weight of a solution of Nafion® 2021 (DuPont) was added to 5025 screen printing conductive ink (DuPont). The mixture thus obtained was screen printed on a layer of Cytop® fluoropolymer through an appropriate stencil. It was then possible for example to print the grid of the transistor directly on a fluoropolymer based dielectric.

Example 3

0.2% by weight of a solution of Nafion® 2021 (DuPont) was added to TEC-IJ-010 (Inkteck) conductive ink for inkjet printing. The mixture thus obtained was compatible with the 60 micron inkjet printing head sold by MicroFab. After inkjet printing and annealing at 100° C., for 20 minutes, of such a mixture obtained on a layer of Cytop® fluoropolymer, a conductive layer was obtained. This mixture made it possible for example to print the grid of the transistor on a fluoropolymer based dielectric.

Example 4

An organic transistor having a top grid configuration was fabricated with P3HT (poly 3-n-hexylthiophene-2,5-diyl) as semiconductor, and Cytop® fluoropolymer as dielectric. The source and drain electrodes were gold. 0.05 g of poly 4-vinylpyridine was added to a solution comprising 1 g of Nafion® 2021 (DuPont) and 20 g of isopropanol. The mixture was screen-printed on the surface of the Cytop® fluoropolymer. The grid of the transistor was printed with an ink containing silver nanoparticles, such as Cabot AG-IJ-G-100-S ink. This transistor, after application of a constant electric field to the grid, produced electrical aging curves compatible with organic electronic applications.

The invention claimed is:

1. A transistor comprising a first deposited layer defining a layer consisting of a hydrophobic fluoropolymer defining a fluoropolymer layer deposited directly on a substrate, said hydrophobic fluoropolymer being selected from the group consisting of a polytetrafluoroethylene, a poly perfluoro butenyl vinyl ether, a copolymer of ethylene and chlorotrifluoroethylene, a tetrafluoroethylene perfluoromethylvinylether copolymer, and a poly(tetrafluoro-para-xylylene), wherein at least a part of a surface of the fluoropolymer layer is covered with a second deposited layer defining a bonding layer deposited directly on said fluoropolymer layer, said bonding layer having a composition comprising a single polymer having both (1) at least one fluorinated function and (2) at least one acid or base function; and
wherein said bonding layer is at least partly covered by and in direct contact with another layer defining an outermost layer that is deposited last, wherein said outermost layer is at least one of an electrode, a semiconductive material, a dielectric, a layer of ink or a layer of adhesive.

2. The transistor as claimed in claim 1, wherein the acid function is provided by a carboxylic, phosphonic, sulfonic, sulfone or $Si(CH_3)_3$ function.

3. The transistor as claimed in claim 1, wherein the base function is provided by an amine.

4. The transistor as claimed in claim 1, wherein the single polymer having both (1) at least one fluorinated function and (2) at least one acid or base function comprises a monomer having at least one fluorinated function that is the same type as a monomer present in the fluoropolymer.

5. The transistor as claimed in claim 1, wherein the fluorinated function and the acid or base function are carried by the same monomer.

6. The transistor as claimed in claim 1, wherein the fluoropolymer is polyterafluoruethylene (PTFE) or butenyl vinyl ether.

7. The transistor as claimed in claim 1, wherein the polymer having at least one fluorinated function and at least one acid or base function is a sulphonated tetrafluoroethylene-based fluoropolymer, a copolymer of perfluorosulfonate and fluoride vinyl ether or a copolymer of perfluorocarboxylate and fluoride vinyl ether.

8. The transistor as claimed in claim 1, wherein the bonding layer further comprises a compound capable of interacting with the acid or base functions of the single polymer.

9. The transistor as claimed in claim 1, wherein of the bonding layer further comprises a resin, an ink or a dielectric.

10. The transistor as claimed in claim 1, wherein the bonding layer has a thickness of between 20 nm and 2 µm.

11. A method for fabricating a transistor as claimed in claim 1, comprising the following steps:
a deposition step of depositing, on at least a part of an outer surface of the fluoropolymer layer which is deposited directly on the substrate, the bonding layer composition comprising a single polymer having both (1) at least one fluorinated function and (2) at least one acid or base function, which forms the bonding layer after drying; and a deposition step of depositing the outermost layer on the bonding layer without any chemical bonding between the bonding layer and the outermost layer.

12. The fabrication method as claimed in claim 11, wherein the deposition steps are carried out by dip-coating, spin-coating or printing.

13. The fabrication method as claimed in claim 11, wherein the bonding layer composition comprising a single polymer having both (1) at least one fluorinated function and (2) at least one acid or base function contains an isopropanol solvent.

14. A transistor device:
wherein said transistor device is in a top grid configuration and comprises source and drain electrodes provided directly on a substrate, a semiconductive material layer provided on said substrate covering said source and drain electrodes, a first fluoropolymer layer provided directly on said semiconductive material layer, said first fluoropolymer layer consisting of a hydrophobic fluoropolymer selected from the group consisting of a polytetrafluoroethylene, a poly perfluoro butenyl vinyl ether, a copolymer of ethylene and chlorotrifluoroethylene, a tetrafluoroethylene perfluoromethylvinylether copolymer, and a poly(tetrafluoro-para-xylylene), a first bonding layer deposited directly on and covering said first fluoropolymer layer, said first bonding layer having a composition comprising a single polymer having both (1) at least one fluorinated function and (2) at least one acid or base function, and an another layer comprising at least one grid electrode covering and directly deposited on said first bonding layer and defining at least a portion of an outermost layer; or
wherein said transistor device is in a bottom grid configuration and comprises at least one grid electrode provided on a substrate, a second fluoropolymer layer provided directly on said substrate and covering said at least one grid electrode, said second fluoropolymer layer consisting of a hydrophobic fluoropolymer selected from the group consisting of a polytetrafluoroethylene, a poly perfluoro butenyl vinyl ether, a copolymer of ethylene and chlorotrifluoroethylene, a tetrafluoroethylene perfluoromethylvinylether copolymer, and a poly(tetrafluoro-para-xylylene), a second bonding layer provided directly on and covering the second fluoropolymer layer, said second bonding layer having a composition comprising a single polymer having both (1) at least one fluorinated function and (2) at least one acid or base function, source and drain electrodes provided directly on said second bonding layer, and a second another layer comprising a semiconductive material covering and directly deposited on said second bonding layer and said source and drain electrodes and defining at least a portion of an outermost layer.

15. A transistor device:
wherein said transistor device is in a top grid configuration and comprises source and drain electrodes provided directly on a substrate, a semiconductive material layer provided on said substrate covering said source and drain electrodes, a first fluoropolymer layer provided directly on said semiconductor material, said first fluoropolymer layer consisting of a hydrophobic fluoropolymer selected from the group consisting of a polytetrafluoroethylene, a poly perfluoro butenyl vinyl ether, a copolymer of ethylene and chlorotrifluoroethylene, a tetrafluoroethylene perfluoromethylvinylether copolymer, and a poly(tetrafluoro-para-xylylene) provided on said semiconductive material layer, a first bonding layer deposited directly on and covering said first fluoropolymer layer, said first bonding layer having a composition comprising a single polymer having both (1) at least one fluorinated function and (2) at least one acid or base function, a first dielectric layer provided directly on and covering said first bonding layer, and an another layer comprising at least one grid electrode covering and directly deposited on said first dielectric layer and defining at least a portion of an outermost layer; or
wherein said transistor device is in a bottom grid configuration and comprises at least one grid electrode provided directly on a substrate, a second dielectric layer provided directly on said substrate and covering said at least one grid electrode, a second bonding layer provided on and covering said second dielectric layer, said second bonding layer having a composition comprising a single polymer having both (1) at least one fluorinated function and (2) at least one acid or base function, a second fluoropolymer layer deposited on said second bonding layer, said second fluoropolymer layer consisting of a hydrophobic fluoropolymer selected from the group consisting of a polytetrafluoroethylene, a poly perfluoro butenyl vinyl ether, a copolymer of ethylene and chlorotrifluoroethylene, a tetrafluoroethylene perfluoromethylvinylether copolymer, and a poly(tetrafluoro-para-xylylene), source and drain electrodes provided directly on said second fluoropolymer layer, and a second another layer comprising a semiconductive material covering and directly deposited on said second fluoropolymer layer and said source and drain electrodes and defining at least a portion of an outermost layer.

* * * * *